United States Patent [19]
Hosack

[11] 4,061,530
[45] Dec. 6, 1977

[54] PROCESS FOR PRODUCING SUCCESSIVE STAGES OF A CHARGE COUPLED DEVICE

[75] Inventor: Harold H. Hosack, Cupertino, Calif.

[73] Assignee: Fairchild Camera and Instrument Corporation, Mountain View, Calif.

[21] Appl. No.: 706,867

[22] Filed: July 19, 1976

[51] Int. Cl.$^2$ .............................. H01L 21/306
[52] U.S. Cl. ....................... 156/653; 29/580; 156/657; 156/661; 156/662; 357/24
[58] Field of Search .......... 156/3, 11, 17, 643, 156/650–657, 659, 661, 662; 148/187; 29/580; 357/24

[56] References Cited
U.S. PATENT DOCUMENTS

| | | | |
|---|---|---|---|
| 3,911,560 | 10/1975 | Amelio et al. | 29/580 X |
| 3,920,861 | 11/1975 | Dean | 427/88 |
| 3,983,620 | 10/1976 | Spadea | 29/571 |

Primary Examiner—William A. Powell
Attorney, Agent, or Firm—Alan H. MacPherson; Henry K. Woodward; Norman E. Reitz

[57] ABSTRACT

An improved method for producing a plurality of closely-spaced altered regions in the surface of a first material possessing a first set of etch characteristics is disclosed. The method includes the steps of forming an etchable mask of a second material over a portion of the first material, which mask has a second set of etch characteristics and a lateral edge disposed along a selected edge of a first of the to-be-altered closely-spaced regions in the first material. A protective layer of a third material possessing a third set of etch characteristics is next formed on the exposed surface of the first material, the protective layer having a second lateral edge juxtaposed the first lateral edge. The first lateral edge of the mask is then etched to expose unprotected portions of the first material. The exposed unprotected portions of the first material are then altered by either etching or diffusion. The above-described steps are repeated as many times as required to produce a plurality of closely-spaced altered regions in the surface of the first material.

2 Claims, 13 Drawing Figures

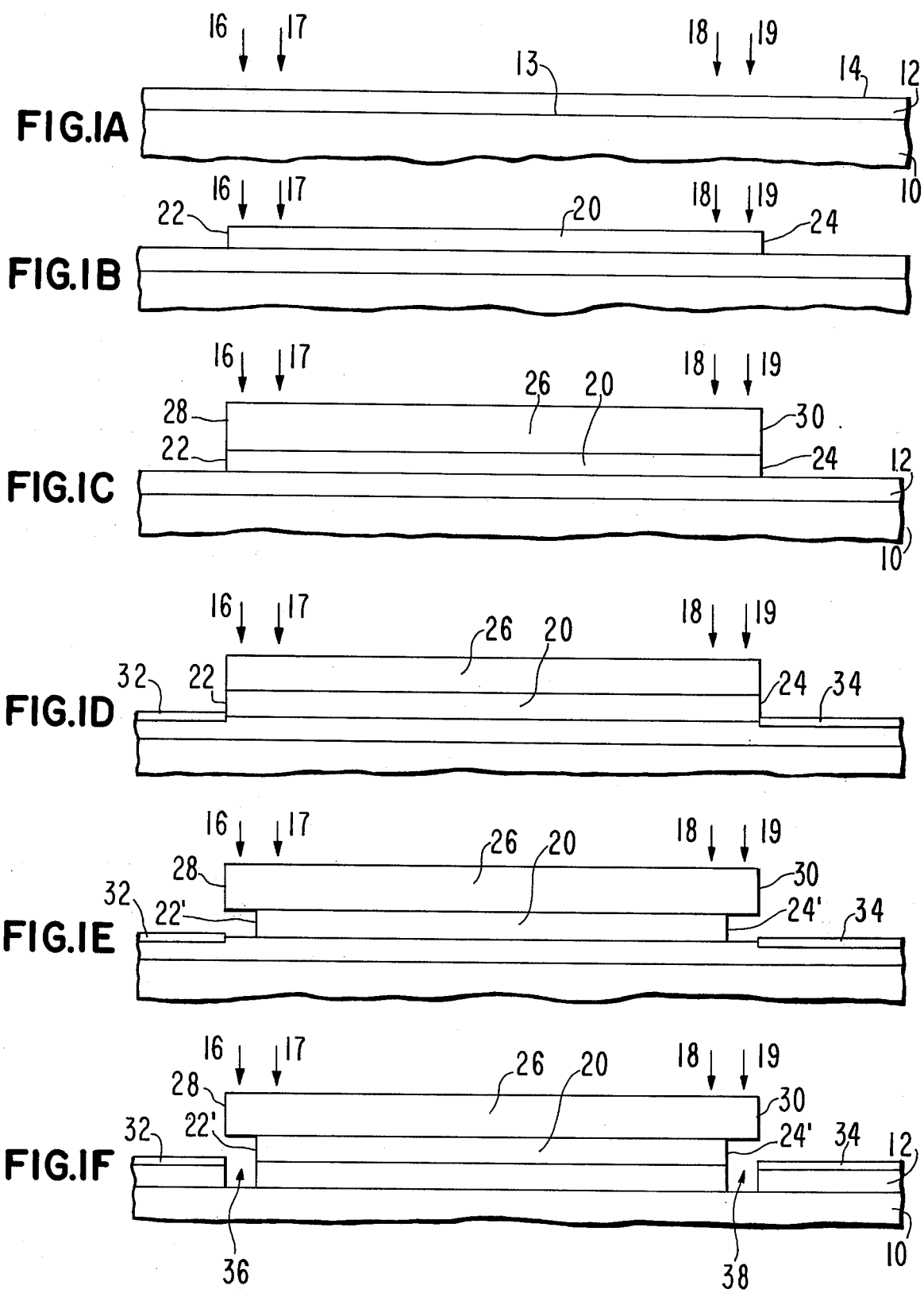

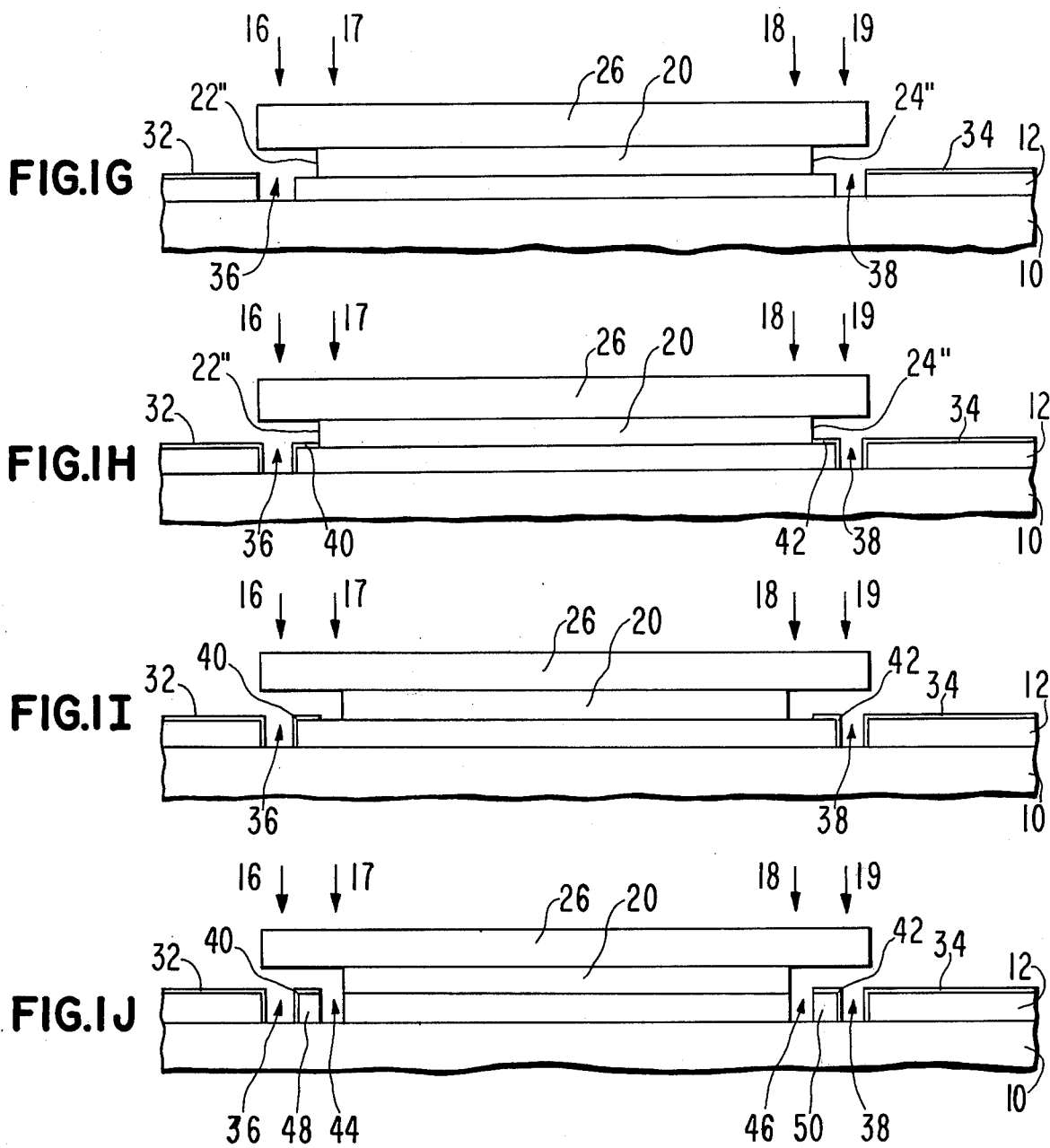

PROCESS FOR PRODUCING SUCCESSIVE STAGES OF A CHARGE COUPLED DEVICE

BACKGROUND OF THE INVENTION

1. Field of the Invention

This invention relates generally to a method and structure well suited for manufacturing integrated-circuit semiconductor devices having fine geometry patterns. In particular, this invention relates to a method and structure for producing a plurality of narrow openings to surfaces of first materials, which openings are separated by narrow strips of second materials.

2. Description of the Prior Art

Techniques for producing fine geometry patterns of one material on the surface of another material are known. One of the most popular techniques, which is widely used in the semiconductor industry, involves forming a layer of photo-resist on the surface of a material, selectively exposing portions of the photoresist to ultraviolet light and developing the exposed photoresist. The size of the patterns which can be produced with this technique are limited by diffraction and reflection effects at the wavelenghts of the radiation used to expose the photoresist. Smaller patterns can be produced by analogous methods employing different photoresist materials and radiation of shorter wavelengths such as an electron beam or X-rays. A thorough discussion of the limitations of conventional photolithography can be found in the July 1975 issue of the IEEE transactions on Electron Devices.

Another technique used to produce a narrow emitter opening in a semiconductor device is disclosed in U.S. Pat. No. 3,940,288, which issued on Feb. 24, 1976 to Takagi, et al. This technique was also disclosed in a paper entitled "A New Sub-Micron Emitter Formation with Reduced Base Resistance for Ultra High-Speed Devices" by H. Kamioka, et al., presented in December 1974 to the International Electron Devices Meeting held in Washington, D.C., and published starting on page 279 in the technical digest of that meeting. This technique teaches the formation of a narrow layered sandwich (usually about 3 microns wide) of silicon nitride, silicon dioxide and silicon nitride centered over the desired location of the emitter opening on the surface of a silicon substrate. The sandwiched layer of silicon dioxide is then laterally etched inward from both sides to form with the two nitride layers a structure with an "I-beam" cross-sectional configuration. The vertical rib of remaining silicon dioxide protectively masks an underlying ribbon (approximately 0.5 micron wide) of silicon nitride while the exposed portions of silicon nitride are etched away from both sides. The overlying masking silicon dioxide rib is subsequently removed and a layer of silicon dioxide is formed on the exposed surface of the silicon substrate. The remaining ribbon of silicon nitride, which defines both the width and location of the narrow emitter opening, is then removed, thereby exposing a portion of the silicon substrate surface.

The selective lateral etching of a small-area-bounding lateral edge on an adjacent overlying layer of one material to expose a larger area of the underlying material is shown in U.S. Pat. No. 3,783,047, which issued to M. M. Paffen et al on Jan. 1, 1974, entitled "Method of Manufacturing a Semiconductor Device and Semiconductor Device Manufactured by Using Such a Method." The method taught by Paffen et al. is used to produce a semiconductor device having a small zone with one selected set of electrical properties and a larger zone with another set of electrical properties.

The use of a selective lateral etch is described by C. N. Berglund et al in a paper entitled "Undercut Isolation — A Technique for Closely Spaced and Self-Aligned Metalization Patterns for MOS Integrated Circuits." This paper was published in September, 1973 beginning on page 1255 of Vol. 120, No. 9 of the Journal of the Electrochemical Society. C. N. Berglund et al take advantage of the shadowing effect of an undercut area etched in a two-layer insulator sandwich. Because of the masking effect of an undercut edge a thin metal film evaporated at an appropriate angle to the edge will be discontinuous at the undercut edges, resulting in electrically isolated metalization patterns at different vertical levels with negligible lateral spacing between them. Berglund et al illustrate an application for this technique by describing the design of a two-phase CCD (Charge-Coupled Device).

Although electron beam and X-ray lithographic techniques can be used to produce narrow openings separated by narrow strips of overlying materials, which make possible smaller semiconductor elements and higher chip densities than previously obtained using less advanced methods, these techniques have many disadvantages. Not only is the equipment required to practice the electron-beam technique presently very expensive, but this technique also presently requires prolonged photoresist exposure times which are unsuitable for mass production. Optimized equipment required to practice X-ray lithography on a production scale is not currently available. Moreover, in addition to the well-known hazards and fail-safe precautionary measures associated with the use of X-rays, this technique requires a high precision mask often made of heavy metal, such as gold, possessing geometries as fine as those to be produced on the surface of the material. Such masks are generally produced with electron-beam techniques and are both expensive and difficult to produce.

The size of geometries producible with the double-sided etch method of Takagi et al, or Kamioka et al, is limited by the fact that the silicon dioxide rib must be sufficiently wide to support the overhanging layer of silicon nitride. Additionally, although the lateral etch rate of silicon dioxide is in theory controllable to render the depth of undercut a function of etch time, as the depth of undercut is increased to produce an ever-narrower silicon dioxide rib, difficulty increases in controlling etch rate, etch uniformity, and hence the size of the to-be-formed geometric pattern. Further, as the etch process occurs simultaneously from two sides, the uncertainty in the size of the to-be-formed geometric pattern increases due to the combined uncertainty in the locations of the converging edges at any given time.

More recently, an improved method and structure for producing narrow openings to the surface of a first material possessing a first set of etch characteristics was disclosed in patent application Ser. No. 619,735, filed Oct. 6, 1975, by the same inventor hereof and assigned to the same assignee as this invention, which application is a continuation-in-part of co-pending application Ser. No. 581,389 filed May 27, 1975, now abandoned. The present invention, in contrast to the above-identified invention, discloses and claims a method and structure for producing a fine geometric pattern on the surface of a first material.

SUMMARY OF THE INVENTION

This invention, in contrast to Takagi, et al's or Kamioka, et al's technique, achieves narrower openings with narrower strips of material between the openings (i.e., smaller geometric patterns) by reducing rather than increasing the lateral etch time; and, by etching only one, rather than two, lateral edges of a masking material to produce each part of the geometric pattern. Thus, the present invention is not structurally limited as is the Takagi et al. or Kamioka et al. technique in the narrowness of openings or overlying strips of material which are producible by that technique. Moreover, since a shorter etch time is required for producing a fine geometric pattern with the method and structure of the present invention, the non-uniformities in the width of the to-be-formed opening or strip due to local variations in the etch rate are reduced.

In accordance with this invention, a process for producing a plurality of closely spaced openings in a first material possessing a first set of etch characteristics is provided which comprises the steps of forming an etchable mask over a portion of the first material, the etchable mask having a first narrow-opening-forming lateral edge disposed along a selected edge of a first of the to-be-formed closely spaced narrow openings; forming a protective layer of a second material possessing a second set of etch characteristics on exposed portions of said first material, the protective layer having a lateral edge juxtaposed the first narrow-opening-forming lateral edge; etching the first narrow-opening-forming edge on the mask to expose unprotected portions of the first material; etching openings in the exposed portions of the first material; etching the mask a second time to expose additional unprotected portions of the first material; forming an additional protective layer of the second material on exposed portions of the first material; etching the mask a third time to expose additional unprotected portions of the first material; and etching openings in the exposed portions of the first material, thereby forming closely spaced openings in the first material.

BRIEF DESCRIPTION OF THE DRAWINGS

FIGS. 1A through 1J are stylized partial cross-sectional views of starting, intermediate and final structures employed in the practice of this invention; and, FIGS. 2A through 2C are stylized partial cross-sectional views of a typical structure being manufactured by the process of this invention.

DETAILED DESCRIPTION

Figure 2A:
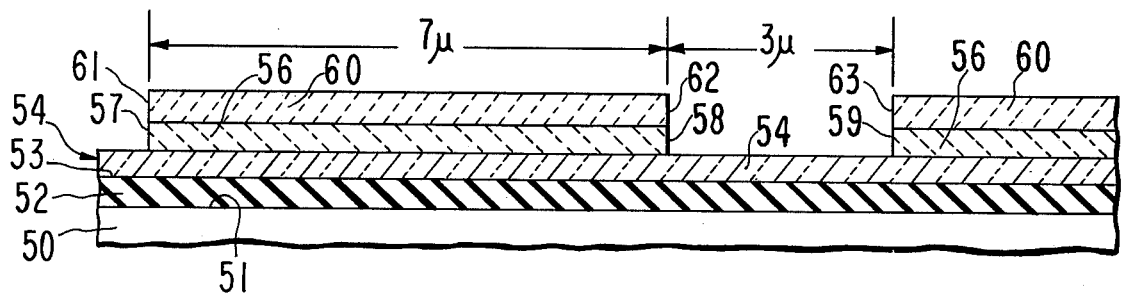

This invention provides a generalized method and structure for providing a plurality of narrow openings through an overlying material or materials to the surface of a first material, which narrow openings are separated by a plurality of narrow strips of the overlying material or materials. An understanding of this method and structure will be achieved by reference first to FIG. 1, which is a partial cross-sectional view of such a first material 10 with an overlying second material 12. The first material 10 possesses a first set of etch characteristics and a substantially planar surface 13 upon which the second material 12 is formed. The second material 12 possesses a second set of etch characteristics and a substantially planar surface 14. In order to form a plurality of narrow openings to the surface 13 of the first material 10 at, for example, selected locations 16, 17, 18 and 19, an etchable mask 20 is formed in a selected pattern on a portion of the surface of the second material 12 as shown in FIG. 1B. The etchable mask 20 possesses first and second narrow-opening-forming lateral edges 22 and 24. It is noted, however, that only one edge of the etchable mask 20, such as edge 22, need be employed for forming one or more closely spaced narrow openings in the material 12.

The lateral edges 22 and 24 are shown throughout the several figures disposed substantially perpendicular to the surface 13 of the first material 10. However, it is to be understood that throughout this application whenever reference is made to a "lateral edge" such an edge may be disposed perpendicularly or at an angle to the referenced surface, and further that such a "lateral edge" can be straight, or concave, or convex, or some compound combination thereof.

Next, a protective layer of a third material 26 possessing a third set of etch characteristics is formed on the exposed surface of the etchable mask 20. The protective layer of third material 26 possesses second narrow-opening forming lateral edges 28 and 30 in vertical registration with the first narrow-opening-forming lateral edges 22 and 24 as is shown in FIG. 1C. It is pointed out, however, that the third material 26 is not needed to produce the fine geometry patterns in the overlying material 12 on the surface 13. The third material 26 is employed to obtain more control of the lateral etching of the edges 22 and 24, and to reduce the required thickness of the etchable mask 20. The particular arrangement of materials shown in FIG. 1C can be provided by several techniques well known to those versed in semiconductor manufacturing technology. For example, successive deposition can be made of the materials 20 and 26 over the material 12 with a shadow mask protectively covering that portion of the surface 14 of the material 12 on which a layered material is not desired. Another method of forming the structure shown in FIG. 1C is by the deposition of uniform layers of materials 20 and 26 on the surface 14 of material 12 followed by photo-lithographic definition and etching steps common to the semiconductor industry.

Lastly, before any etching of materials, the exposed surface portions of material 21 are passivated, which may typically comprise an oxidation process. Passivated surfaces 32 and 34 of the material 12 are illustrated in FIG. 1D as having edges juxtaposed with the lateral edges 22 and 24 of the material 20.

An etching solution is applied to the structure illustrated in FIG. 1D, which etchant is active only on the second material 20. That is, this etchant attacks the lateral edges 22 and 24 only, and recedes edges 22 and 24 to edges 22' and 24' as illustrated in FIG. 1E. The distance at which edges 22 and 24 are moved to edges 22' and 24' is determined by the amount of time which the structure illustrated in FIG. 1D is exposed to the etchant.

A different etchant is next applied to the structure illustraded in FIG. 1E, which etchant is active only on the material 12. Accordingly, openings 36 and 38 are formed in the material 12 as illustrated in FIG. 1F. By applying this etchant to the FIG. 1E structure for a sufficient amount of time, openings 36 and 38 may be formed down to the surface of the material 10 as illustrated in FIG. 1F.

The structure illustrated in FIG. 1F is again exposed to an etchant which is active only upon the material 20, thereby causing edges 22' and 24' to recede to edges 22" and 24" as illustrated in FIG. 1G.

Following this step, the exposed portions of the surface of the material 12 are again passivated, such as, for example, by an oxidation process, which forms additional passivated layers 40 and 42 on the material 12 as illustrated in FIG. 1H.

The structure illustrated in FIG. 1H is again etched by the etchant active only on the material 20 to again recede the edges of the material 20 similar to that as illustrated in FIG. 1I.

The structure as shown in FIG. 1I is again etched by an etchant active only upon the material 12 which forms openings 44 and 46 in the material 12. The openings 44 and 46 may likewise be formed down to the surface 13 of the material 10.

Thus, narrow pattern strips 48 and 50 of the material 12 are formed on the surface 13 of the material 10. However, it is pointed out that openings 36, 38, and 44, 46 need not be made to totally penetrate the material 12, but can be formed as grooves in the surface of the material 12 by controlling or limiting the etch time. In addition, it is clear that the process applied to the narrow openings to the surface of the second material as shown in FIG. 1E and FIG. 1I need not be etching, but would be any other process desired to alter the characteristics of the exposed portions of the second material.

The above-described sequence of steps can be repeated numerous times to produce numerous pattern strips of the material 12, such as strips 48 and 50 over the material 12. It should be understood, however, that the pattern strips 48 and 50 need not be formed simply in straight lines, but can be formed in any planar shape as determined by the planar shape of the edges of the materials 20 and 26.

The number of times at which the above-described steps can be repeated is determined by the sagging moment of the overlying material 26. That is, the material 26 may sag from its own weight and restrict the material etchant from penetrating deep enough to etch the exposed edges of the material 20. On the other hand, material 26 may be masked and a portion thereof etched away to allow additional steps of lateral etching of the formation of additional pattern strips such as strips 48 and 50. Or, the material 26 may be etched for one-half the time required to remove the entire layer, thereby removing the overlying ledges since the etchant attacks both sides of the ledge simultaneously.

Accordingly, it has been shown that a plurality of closely spaced openings are produced in the material 12 down to the surface 13 of the underlying material 10, thereby forming a fine geometric pattern (e.g., strips 48 and 50) of the material 12 over the surface 13.

FIGS. 1A through 1J are intentionally shown in stylized form without cross-sectional cross-hatching suggestive of specific materials. These figures are so rendered in an effort to emphasize the broad scope of the process and structure of the invention. A specific example of a portion of a useful article of manufacture which embodies and serves to further illustrate the process and structure of the invention using specific selected materials is provided herein-below.

The above-described process of the present invention is useful in the manufacture of numerous semiconductor device structures. One such semiconductor structure is a charge-coupled device (CCD), which typically comprises a metal-insulator-semiconductor structure in which minority carriers are stored in "spatially defined depletion regions," also called "potential wells," at the surface of the semiconductor material. Such devices are useful not only as shift registers and delay lines, but are also useful as imaging devices possessing dynamic range and/or sensitivity characteristics that depend upon the physical features of the metal-insulator-semiconductor structure.

A CCD structure is formed with a series of Metal-Oxide-Semiconductor (MOS) capacitors separated by non-conducting gaps. The capacitor electrodes and gaps there-between can be formed by the process of the present invention as illustrated in FIGS. 2A through 2C and described herein-below.

Figure 2B:
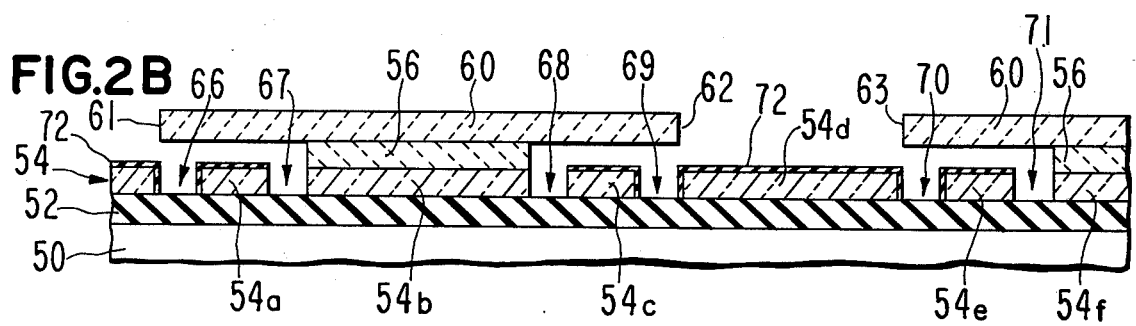
Figure 2C:
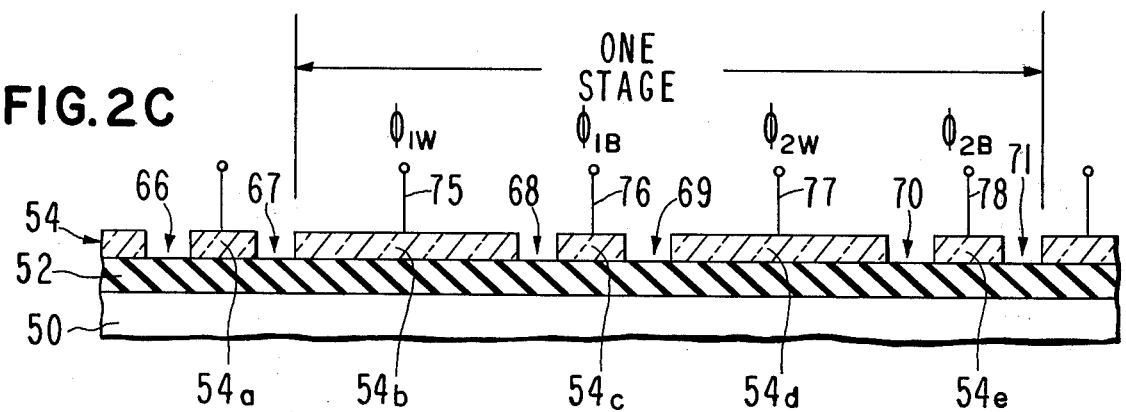

Referring now to FIG. 2A, a semiconductor substrate 50 with a substantially planar surface 51 is shown with an overlying insulating layer 52 also having a substantially planar surface 53.

The substrate 50 typically comprises monocrystalline silicon on either $p$ or $n$ type semiconductor material. The insulating layer 52 typically comprises an oxide of the substrate, Viz. silicon dioxide. Next, a layer 54 of a conductive material, such as for example doped polycrystalline silicon, is formed over the insulating layer 52.

A layer 56 of the etchable masking material, such as for example silicon nitride, is selectively formed in a segmented pattern over the layer 54 by any of the well-known techniques in the semiconductor art. The material employed for layer 56 should have etch characteristics different from that of the material employed for layer 54. In the example shown in FIG. 2A, layer 56 is formed in a pattern of seven micron wide strips with 3 micron wide separations therebetween. It is pointed out at this juncture of the description that FIGS. 2A through 2C are partial cross-sectional views of a CCD structure during manufacture thereof, and that part illustrated is repeated many times. The etchable mask layer 56 possesses narrow-opening-forming lateral edges, of which edges 57, 58 and 59 are shown in FIG. 2A.

An additional layer 60 of another type of masking material, such as for example vapor oxide (VAPOX), is selectively formed over the segmented layer 56.

The structure as shown in FIG. 2A is processed in the same manner as generally described hereinabove to produce a structure as shown in FIG. 2B. Narrow openings 66 through 71 are formed in the layer 54 by the above-described process, thereby dividing this layer into parts 54a through 54f as shown in FIG. 2B. Note also that the size of for example parts 54a of the layer 54 is not the same size as part 54b of this layer. The size of the parts of layer 54, as well as the size of the openings 66 through 71 is controlled by the lateral edge etch time described hereinabove.

After the remaining parts of the etchable mask layer 56 and the overlying layer 60 have been removed, a structure as shown in FIG. 2C results. Such a structure is suitable for use as a two-phase/four electrode CCD. In particular, parts 54b, 54c, 54d and 54e of layer 54 form the four electrodes of one state of the CCD.

Electrical conductors 75, 76, 77 and 78 are formed in ohmic contact with parts 54b, 54c, 54d, and 54e, respectively, which parts act as capacitor electrodes for the CCD structure. Clock signals designated herein as $\phi 1_W$ and $\phi 2_W$, which signals are provided 90 degrees out of phase from one another, are applied to the electrodes by means of the electrical conductors. However, in order to produce uni-directional charge flow the clock signals $\phi 1_B$ and $\phi 2_B$ are provided at the same phase relationship with the $\phi 1_W$ and $\phi 2_W$ clock signals, but with a greater amplitude swing. Such a clocking configuration with four electrodes and two phase accomplishes the same results as prior art devices employing two phase clocks with two electrodes in conjunction with implanted barriers. The CCD structure of FIG. 2C has the distinct advantage over the prior art implanted barrier structure in that no undesired potential variations are generated in the resulting CCD potential profile. Thus, a smoother transistion of charge from one stage to the next is effected.

From the foregoing detailed description it will be evident that there are a number of changes, adaptations and modifications of the present invention which come within the province of those skilled in the art; however, it is intended that all such variations not departing from the spirit of the invention be considered as within the scope thereof as limited solely by the appended claims.

I claim:

1. A process for producing successive stages of a charge coupled device on a semiconductor substrate comprising the steps of:
   a. forming a layer of insulating material on a semiconductor substrate;
   b. forming a layer of a conductive material on said layer of insulating material;
   c. forming an etchable mask over portions of said layer of a conductive material, said etchable mask being etchable by different etches than said layer of a conductive material, said etchable mask having lateral edges disposed along selected edges of closely spaced narrow openings to be formed in said layer of a conductive material;
   d. forming a layer of protective material over exposed portions of said layer of a conductive material, said layer of protective material having lateral edges which overly in one-to-one relation the lateral edges of said etchable mask;
   e. etching said lateral edges of said etchable mask to expose unprotected portions of said layer of conductive material;
   f. etching the exposed portions of said layer of a conductive material down to the surface of said layer of insulating material;
   g. etching the exposed edges of said etchable mask a second time to expose additional unprotected portions of said layer of conductive material;
   h. forming another layer of protective material over the exposed portions of said layer of conductive material;
   i. etching the exposed edges of said etchable mask a third time to expose further unprotected portions of said layer of conductive material; and
   j. etching the then exposed portions of said layer of conductive material down to the surface of said layer of insulating material, thereby producing narrow segments of said conductive material on said layer of insulating material.

2. A process in accordance with claim 1 wherein said layer of insulating material is a layer of silicon dioxide, said layer of a conductive material is a layer of doped polycrystalling silicon, said etchable mask is silicon nitride and said layer of protective material is a layer of silicon dioxide.

* * * * *